United States Patent

Nagase et al.

(10) Patent No.: US 7,714,401 B2
(45) Date of Patent: May 11, 2010

(54) SOLID STATE IMAGING DEVICE AND METHOD OF MANUFACTURING THE SAME

(75) Inventors: Masanori Nagase, Miyagi (JP); Jiro Matsuda, Miyagi (JP); Tsuneo Sasamoto, Miyagi (JP); Toshiaki Hayakawa, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/952,755

(22) Filed: Dec. 7, 2007

(65) Prior Publication Data
US 2008/0173905 A1 Jul. 24, 2008

(30) Foreign Application Priority Data
Dec. 18, 2006 (JP) .......................... P2006-339811

(51) Int. Cl.
*H01L 27/14* (2006.01)
(52) U.S. Cl. .................. 257/431; 257/292; 257/293; 257/294; 257/E21.422; 257/E27.131
(58) Field of Classification Search ............. 257/202, 257/292–294, 431–444, E21.442, E27.131
See application file for complete search history.

(56) References Cited

U.S. PATENT DOCUMENTS

| 5,774,182 | A  | * | 6/1998 | Mutoh et al. | ................ | 348/311 |
| 2005/0040395 | A1 | * | 2/2005 | Hong | ........................ | 257/40 |
| 2007/0279502 | A1 | * | 12/2007 | Inoue | ........................ | 348/272 |

FOREIGN PATENT DOCUMENTS

JP  2005-209714 A  8/2005

\* cited by examiner

*Primary Examiner*—Cuong Q Nguyen
*Assistant Examiner*—Cathy N Lam
(74) *Attorney, Agent, or Firm*—Birch, Stewart, Kolasch & Birch, LLP

(57) ABSTRACT

A solid state imaging device comprises: a photoelectric converting portion provided on a semiconductor substrate; a charge transfer path, formed in an adjacent position to the photoelectric converting portion, that receives a signal charge generated in the photoelectric converting portion and transfers the signal charge in a predetermined direction; and a gate electrode that transfers the signal charge from the photoelectric converting portion to the charge transfer path, wherein the gate electrode comprises polysilicon having a different conductive type from that of a semiconductor region forming a charge storing portion of the charge transfer path.

8 Claims, 14 Drawing Sheets

FIG. 15A        RELATED ART
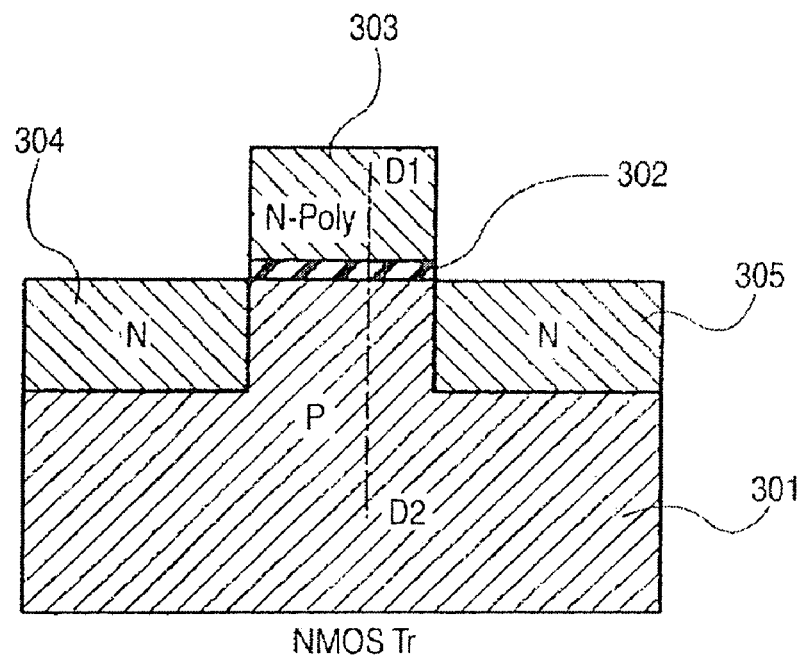
NMOS Tr
FIG. 15B        RELATED ART
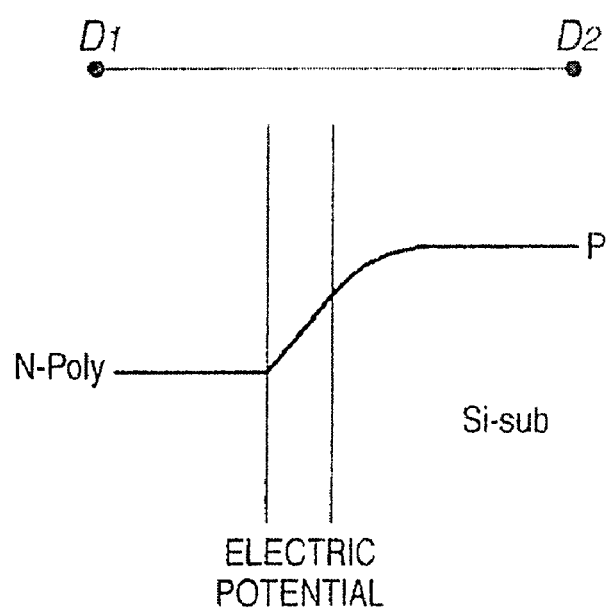

SOLID STATE IMAGING DEVICE AND METHOD OF MANUFACTURING THE SAME

BACKGROUND OF THE INVENTION

1. Field of the Invention

The present invention relates to a solid state imaging device and a method of manufacturing the solid state imaging device.

2. Description of the Related Art

Referring to a solid state imaging device to be used in a digital camera, particularly, a solid state imaging device using a CCD (Charge Coupled Devices), it is necessary to suppress the generation of a smear to be a peculiar noise. In the case in which an object includes a light or sun having a high luminance, the smear easily appears. Actually, the noise seems to be whitish like a stripe or a band in upper and lower parts of a portion having a high luminance in an image which is picked up.

It is supposed that the smear appears by a mixture of a charge generated in a pixel portion having a high luminance in an imaging portion provided on the solid state imaging device into charges of other pixels which have been subjected to a photoelectric conversion and are being transferred. For a specific mechanism to generate the smear, four causes shown in (1) to (4) of FIG. 14 can be supposed. In other words, the smear is generated by at least one of the four causes in the following (1) to (4).

(1) A photoelectric conversion in a peripheral portion of a photodiode (PD): A light which is incident from an opening of a photodiode is not restricted to a component having a perpendicular incident angle to a surface. Moreover, the light has a property of a wave. For this reason, a light transmitted through the opening spreads and a photoelectric conversion is also carried out in a gate region provided on the periphery of the photodiode so that a charge corresponding to a noise is generated and mixed into a vertical charge transfer portion (VCCD).

(2) A diffusion current in a P-type region of an embedded photodiode: an electron generated in a $P^+$ region is diffused over a surface of the embedded photodiode and is mixed into the vertical charge transfer portion (VCCD) in an adjacent column.

(3) A reflection and diffraction of a light incident from an opening portion of a shielding film (W or Al): an incident light is reflected or scattered at a boundary having a different refractive index, for example, a surface of a silicon substrate in an edge of the opening of the photodiode, and a charge is generated by the influence of the light and is mixed into the vertical charge transfer portion (VCCD).

(4) A transmission of the light through the shielding film (Al): If the shielding film (W or Al) which shields the vertical charge transfer portion (VCCD) has a defect, a light leaking out of the defect is incident on the vertical charge transfer portion to generate a charge so that a smear is generated.

In a recent solid state imaging device, however, the shielding is sufficiently carried out in many cases. For the actual cause of the smear, a diffusing component of a carrier subjected to the photoelectric conversion in (2) is dominant.

A current solid state imaging device of a CCD type is constituted by using an NMOS process as disclosed in JP-A-2005-209714, for example. More specifically, an electron having a high mobility is used as a carrier in the NMOS process. Therefore, a high speed operation can be carried out and the NMOS process is suitable for a device performance in the case in which a solid state imaging device is manufactured.

In the NMOS process, each circuit element is basically constituted by using an NMOS transistor having a structure shown in FIG. 15A. In FIG. 15A, an insulating layer 302 is formed on a surface of a substrate (a base material) 301 constituted by a P-type semiconductor (silicon), and a gate electrode 303 is formed on the insulating layer 302. Moreover, a source region 304 and a drain region 305 are constituted by an N-type semiconductor (silicon), respectively. Furthermore, in the example, N-type polysilicon (N-Poly) to be a general material is used as the gate electrode 303.

In other words, when a positive voltage is applied to the gate electrode 303 by a capacitor formed between the substrate 301 and the gate electrode 303, an electron is pulled toward a boundary surface between the substrate 301 and the insulating layer 302 so that an inverting layer (N type) is formed between the source region 304 and the drain region 305. A region (channel) having a high conductivity is formed between the source region 304 and the drain region 305 by the inverting layer, and the electron to be the carrier is moved therebetween. The movement of the electron can be controlled by the voltage to be applied to the gate electrode 303.

Referring to the NMOS transistor, it is necessary to employ a surface channel structure in order to reduce an interference (a short channel effect) generated when a distance between the source and the drain is short (2 μm or less). In the case in which it is necessary to reduce a threshold voltage, moreover, an electric potential distribution shown in FIG. 15B is generally formed by using N-type polysilicon as the gate electrode 303 in such a manner that a slight depletion state is generated even if the voltage to be applied to the gate electrode 303 is 0V, for example.

The related-art solid state imaging device of a CCD type using the NMOS process is constituted as shown in FIG. 16. FIG. 16 shows a sectional structure of an imaging cell corresponding to one pixel and a peripheral portion thereof. More specifically, in the imaging cell for generating signal charges corresponding to respective pixels, an N-type semiconductor region 402 provided in a P-type semiconductor region 401 constitutes a photodiode (PD). A $P^+$ region 403 is formed on the N-type semiconductor region 402. Moreover, an N-type semiconductor region 404 for forming a vertical charge transfer portion (VCCD) to transfer the signal charge in a vertical direction is disposed on a side of the N-type semiconductor region 402. In order to transfer, to the vertical charge transfer portion, the signal charge generated and stored by the N-type semiconductor region 402 to be the photodiode, a gate electrode 406 is provided above the N-type semiconductor region 404. The gate electrode 406 and the N-type semiconductor region 404 are isolated from each other through an insulating layer 405. The gate electrode 406 is constituted by using N-type polysilicon (N-Poly) in the same manner as in a general NMOS transistor.

A two-dimensional solid state imaging device includes a large number of imaging cells which are arranged at a regular interval in directions of a row and a column. Therefore, another imaging cell is disposed in an adjacent position to one imaging cell. In the example shown in FIG. 16, an N-type semiconductor region 404(1) on a right side constitutes a vertical charge transfer portion in a column to which the imaging cell belongs, and an N-type semiconductor region 404(2) on a left side constitutes a vertical charge transfer portion belonging to another column which is adjacent to the imaging cell. Moreover, a gate electrode 406(1) is provided to transfer the signal charge from a photodiode of the imaging cell to the N-type semiconductor region 404(1) to be the vertical charge transfer portion in the column to which the imaging cell belongs, and a gate electrode 406(2) is provided to transfer the signal charge from a photodiode of the imaging cell belonging to the adjacent column to the N-type semiconductor region 404(2) of the column to which the imaging cell belongs. Moreover, the imaging cell and the imaging cell in the adjacent column are isolated from each other thorough the P+ region 403.

By the influence of a diffusion current in the P-type region (403) of the embedded photodiode, however, a part of the signal charges generated in the photodiode of the imaging cell are mixed into the vertical charge transfer portion (404(2)) belonging to the imaging cells in other adjacent columns in some cases. Consequently, the smear is caused. In other words, the signal charge leaks into the other adjacent columns through a path of (2) shown in FIG. 14.

In order to reduce the cause of the smear, in the related art, a surface shielding layer (corresponding to the P+ region 403 in FIG. 16) of the embedded photodiode is mainly shallowed as a countermeasure. When the surface shielding layer is excessively shallowed, however, it is impossible to obtain a structure of an embedded photodiode which is an original object. For this reason, there is a problem in that an interface generating current to cause a dark current or a white flaw is increased. Accordingly, the actual shallowness of the surface shielding layer is to be determined by a trade-off of the smear and the interface generating current.

In the related-art solid imaging device, a surface shielding layer is shallowed as a countermeasure for decreasing diffusing components of a carrier generated by a photoelectric conversion of a photodiode. Therefore, restrictions are imposed due to an increase in the interface generating current. Therefore, it is hard to effectively suppress a smear.

When the photodiode is exposed, moreover, the smear is generated. At this time, either a medium potential (VM) or a low potential (VL) is applied to a gate electrode for controlling an electric potential between the photodiode and the vertical charge transfer portion. When the medium potential (VM) is applied to the gate electrode so that the electric potential of the vertical charge transfer portion is reduced, the smear is generated.

By applying a negative bias as the medium potential (VM), accordingly, it is possible to form a potential barrier on an entrance of the vertical charge transfer portion. Therefore, it is possible to prevent the diffusing component of the carrier from flowing into the other adjacent columns, thereby suppressing the generation of the smear.

In the case of the solid state imaging device to be particularly used in a household product, however, it is necessary to reduce a consumed power and to decrease the number of power supplies. Under the actual circumstances, therefore, a ground potential (GND) is to be applied as the medium potential (VM) to the gate electrode. For this reason, the negative bias cannot be applied as the medium potential (VM) in the related-art solid state imaging device so that the potential barrier cannot be formed on the entrance of the vertical charge transfer portion.

SUMMARY OF THE INVENTION

It is an object of the invention to provide a solid state imaging device and a method of manufacturing the solid state imaging device which can effectively reduce a smear while maintaining a characteristic of an embedded photodiode without applying a special voltage to a gate electrode.

The object according to the invention can be achieved by the following structure.

(1) A solid state imaging device comprising:
a photoelectric converting portion provided on a semiconductor substrate;
a charge transfer path, formed in an adjacent position to the photoelectric converting portion, that receives a signal charge generated in the photoelectric converting portion and transfers the signal charge in a predetermined direction; and
a gate electrode that transfers the signal charge from the photoelectric converting portion to the charge transfer path,
wherein the gate electrode comprises polysilicon having a different conductive type from that of a semiconductor region forming a charge storing portion of the charge transfer path.

According to the solid state imaging device, it is possible to effectively reduce a smear while maintaining a characteristic of an embedded photodiode without applying a special voltage (a negative bias) from an outside of the gate electrode.

For example, in the case in which a solid state imaging device using an NMOS process is constituted, a semiconductor region forming the charge storing portion of the charge transfer path is formed by a semiconductor region having an N conductive type (which implies a doping polarity). In that case, therefore, the gate electrode is formed of polysilicon having the N conductive type. On the contrary, in the case in which the solid state imaging device using a PMOS process is constituted, the semiconductor region forming the charge storing portion of the charge transfer path is formed by a semiconductor region having a P conductive type. In that case, therefore, the gate electrode is formed of polysilicon having the P conductive type.

In other words, while the gate electrode is formed of the N-type polysilicon in the related-art solid state imaging device using the NMOS process, the gate electrode is formed of the P-type polysilicon having a different conductive type in the invention.

A work function has a great difference between the N-type polysilicon and the P-type polysilicon which can be utilized as a material for the gate electrode. For example, the work function has almost a difference in an amount corresponding to a band gap difference (approximately 1.1 V) between N+ type polysilicon and P+ type polysilicon, for example. The "work function" represents the lowest energy which is required for an electron to get out of a metal.

In other words, if the material of the gate electrode is changed from the N-type polysilicon to the P-type polysilicon, an electric potential distribution between the photoelectric converting portion and the charge transfer path is varied depending on a difference between their work functions so that a movement of a carrier generated by the photodiode is changed greatly. More specifically, when the material of the gate electrode is changed from the N-type polysilicon to the P-type polysilicon, the same result as that in an application of a potential of (VM-1.1(V)) is obtained effectively. Even if a negative bias is not applied as the medium potential (VM), therefore, it is possible to obtain the same result as that in the application of the negative bias.

The related-art general solid state imaging device is constituted by using an NMOS process, and the N-type polysilicon is used as the gate electrode in the same manner as in a general device using the NMOS process. More specifically, it is also possible to produce an advantage that a high speed operation can be carried out in a fine structure having a line width of approximately 0.25 μm, for example, by using the h-type polysilicon as a material for the gate electrode. For this reason, the N-type polysilicon is generally used as the gate electrode in the solid state imaging device constituted by using the related-art NMOS process. However, it is also possible to constitute the solid state imaging device by using the P-type polysilicon. If the advantage is produced, the P-type polysilicon can be utilized properly.

(2) The solid state imaging device according to (1) wherein the semiconductor region forming the charge storing portion of the charge transfer path has an N conductive type, and the gate electrode comprises polysilicon having a P conductive type.

According to the solid state imaging device, it is assumed that the solid state imaging device is constituted in the NMOS process. Therefore, the charge storing portion of the charge transfer path is formed by the semiconductor region having the N-type conductive type and the gate electrode is formed of polysilicon having the P-type conductive type. In the same manner as in (1), accordingly, the same result as that in the effective application of the potential of (VM-1.1(V)) as the medium potential (VM) is obtained and the same result as that in the application of a negative bias is obtained even if the negative bias is not applied as the middle potential (VM) as compared with the case in which the N-type polysilicon is used for the gate electrode. Therefore, it is possible to effectively reduce the smear while maintaining a characteristic of an embedded photodiode without applying a special voltage (a negative bias) from an outside to the gate electrode.

(3) The solid state imaging device according to (2) further comprising, as the charge transfer path: a plurality of vertical charge transfer paths that transfers a signal charge received from the photoelectric converting portion in a vertical direction; and a horizontal charge transfer path, formed on a downstream side of the vertical charge transfer path, that transfers the signal charge received through the vertical charge transfer path in a horizontal direction, wherein the solid state imaging device further comprises a charge transfer electrode that controls transfer of the signal charge for at least one of the vertical charge transfer paths and the horizontal charge transfer path, the charge transfer electrode comprising polysilicon having a P conductive type.

According to the solid state imaging device, the charge transfer electrode for controlling the transfer of the signal charge through the vertical charge transfer path or the horizontal charge transfer path is also formed by the P-type polysilicon in addition to a gate electrode. More specifically, the charge transfer electrode of the vertical charge transfer path or the horizontal charge transfer path is formed by using the same material as the gate electrode. Therefore, it is possible to prevent a manufacturing process from being complicated.

(4) The solid state imaging device according to (2) further comprising, as the charge transfer path: a plurality of vertical charge transfer paths that transfers a signal charge received from the photoelectric converting portion in a vertical direction; a line memory, formed on a downstream side of the vertical charge transfer path, that executes to hold and transfer the signal charge received from the vertical charge transfer path; and a horizontal charge transfer path, formed on a downstream side of the line memory, that transfers the signal charge received through the line memory in a horizontal direction, wherein the solid state imaging device further comprises a charge transfer electrode that controls transfer of the signal charge for at least one of the vertical charge transfer paths, the line memory and the horizontal charge transfer path, the charge transfer electrode comprising polysilicon having a P conductive type.

According to the solid state imaging device, the charge transfer electrode for controlling the transfer of the signal charge through the vertical charge transfer path, the line memory or the horizontal charge transfer path is also formed by the P-type polysilicon in addition to a gate electrode. More specifically, the charge transfer electrode of the vertical charge transfer path, the line memory or the horizontal charge transfer path is formed by using the same material as the gate electrode. Therefore, it is possible to prevent a manufacturing process from being complicated.

(5) The solid state imaging device according to (3) or (4), wherein the photoelectric converting portions and the vertical charge transfer paths form a plurality of columns, in which each of the columns comprises: a set of ones of the photoelectric converting portions: and one of the vertical charge transfer paths adjacent to the set of ones of the photoelectric converting portions, a first one of the columns comprises: a set of first ones of the photoelectric converting portions; and first one of the vertical charge transfer paths, a second one of the columns comprises: a set of second ones of the photoelectric converting portions; and second one of the vertical charge transfer paths, the first and second ones of the columns are adjacent to each other, a device isolating region is formed between the set of first ones of the photoelectric converting portions and the second one of the vertical charge transfer paths, and the charge transfer electrode controls signal charge transfer of the second one of the vertical charge transfer paths and is formed to be protruded to an intermediate position of the device isolating region from a position of the second one of the vertical charge transfer paths toward the set of first ones of the photoelectric converting portions which is adjacent thereto.

According to the solid state imaging device, it is possible to further enhance the effect of preventing the carrier generated by the photodiode (the first photoelectric converting portion) in each pixel position from leaking as a diffusion current into the vertical charge transfer portion (the second vertical charge transfer path) in another adjacent column.

With a general structure, a charge transfer electrode for controlling a signal charge transfer of each vertical charge transfer path is constituted in such a dimension and shape that a width and a position are equal to those of the semiconductor region (channel) of the vertical charge transfer path. In the solid state imaging device in (5), however, the charge transfer electrode for controlling the signal charge transfer of the second vertical charge transfer path is formed to be protruded to the intermediate position of the device isolating region from the position of the second vertical charge transfer path toward the first photoelectric converting portion which is adjacent thereto. Consequently, it is possible to increase the effect of preventing the diffusion current from flowing from the first photoelectric converting portion to the second vertical charge transfer path in the adjacent column. Thus, it is possible to enhance the effect of suppressing a smear.

When the charge transfer electrode in the adjacent column is caused to excessively approach the first photoelectric converting portion, conversely, there is a higher possibility that the signal charge is read from the first photoelectric converting portion to the adjacent column. For this reason, it is necessary to hold an amount of the protrusion of the charge transfer electrode up to the intermediate position of the device isolating region.

(6) A method of manufacturing the solid state imaging device according to any of (1) to (5), the method comprising:

forming a first conductive type layer for forming the charge storing portion of the charge transfer path on the semiconductor substrate; and forming a gate electrode having a second conductive type which is different from the first conductive type layer on the first conductive type layer through an insulating layer.

According to the method of manufacturing the solid state imaging device, it is possible to manufacture any of the solid state imaging devices in (1) to (5).

BRIEF DESCRIPTION OF THE DRAWINGS

FIG. 5 is an enlarged sectional view showing a sectional structure related to an imaging cell and a periphery thereof in the solid state imaging device illustrated in FIG. 2, FIGS. 6A and 6B are typical charts representing a result of a simulation related to the imaging cell and the periphery illustrated in FIG. 5, in which FIG. 15A is a longitudinal sectional view showing a structure of an NMOS transistor having a general structure and FIG. 15B is an explanatory diagram showing an electric potential distribution on a D1-D2 line.

DETAILED DESCRIPTION OF THE INVENTION

First Embodiment

A preferred embodiment of a solid state imaging device according to the invention will be described below in detail with reference to the drawings.

Figure 1:
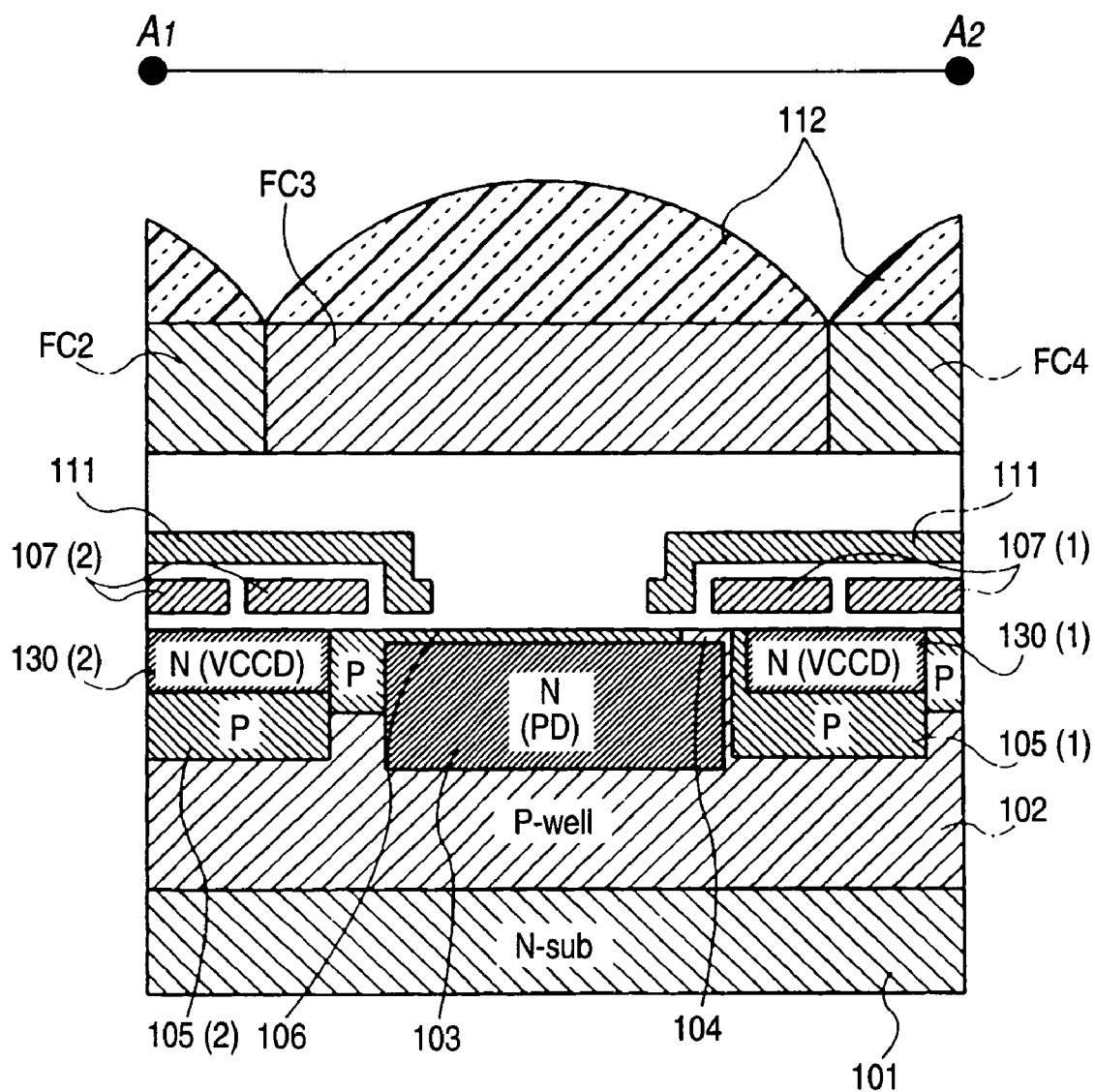
FIG. 1 is a sectional view showing an imaging portion of a solid state imaging device according to the invention.
Figure 2:
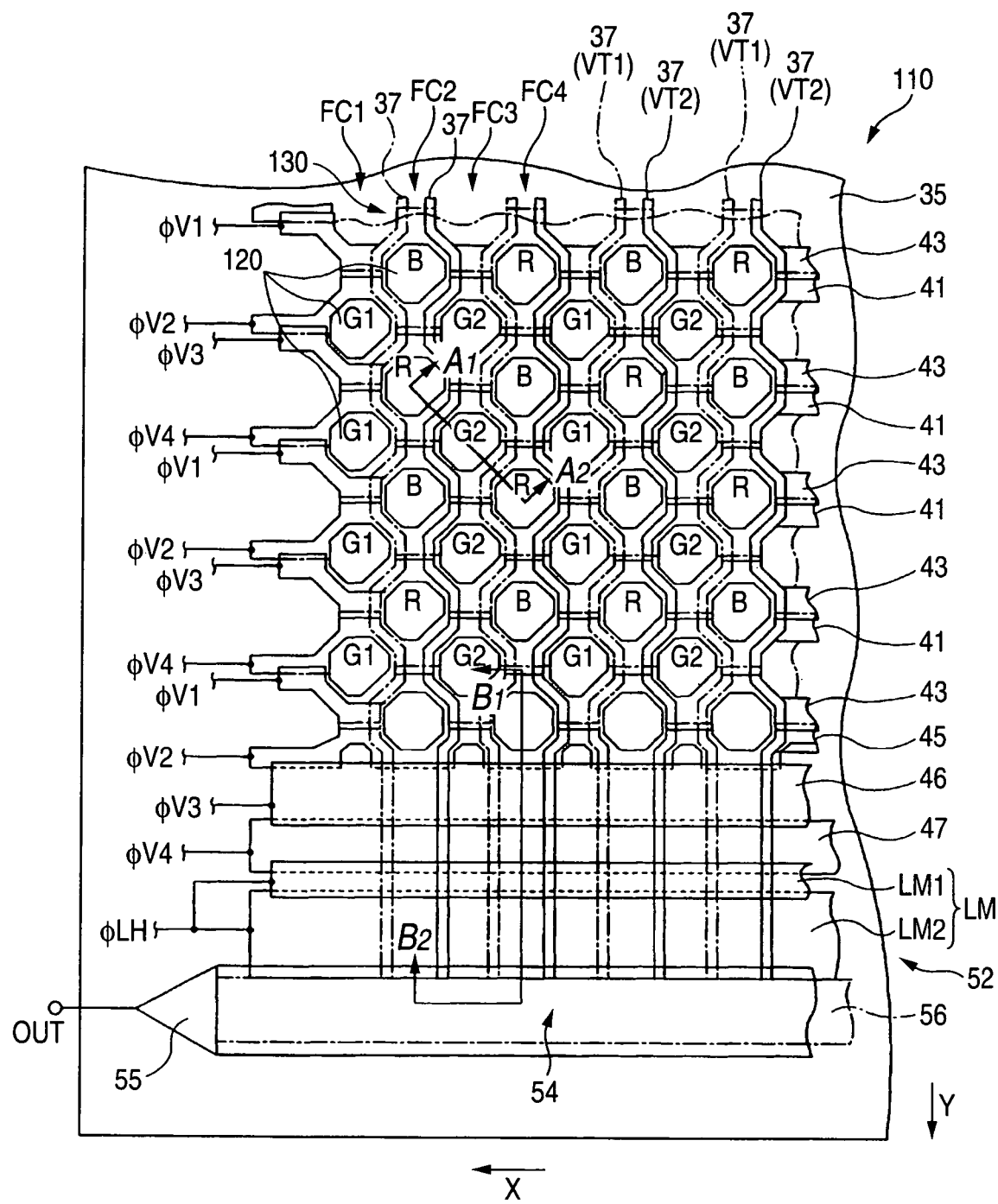
FIG. 2 is a plan view showing an example of a structure of a main part in a solid state imaging device according to a first embodiment.

FIG. 1 is a sectional view showing an imaging portion of the solid state imaging device according to the invention and FIG. 2 is an enlarged plan view showing a main part of the solid state imaging device illustrated in FIG. 1. FIG. 1 shows a structure of an A1-A2 section of the solid state imaging device illustrated in FIG. 2.

The solid state imaging device shown in FIGS. 1 and 2 constitutes a two-dimensional CCD image sensor. More specifically, there is provided an imaging portion 110 in which a large number of imaging cells 120 are two-dimensionally disposed in a row direction (a direction of an arrow X) and a column direction (a direction of an arrow Y) over a plane. Each of the imaging cells 120 includes a photodiode (PD) constituted by a semiconductor and generates a signal charge corresponding to a light quantity determined by an intensity of a light which is incident on each light receiving surface and a length of an exposure time.

In order to fetch a signal charge output from each of the large number of imaging cells 120 which are two-dimensionally disposed as a signal per frame in time series from an output terminal of the solid state imaging device, a plurality of vertical charge transfer portions (VCCDs) 130, a line memory 52, a horizontal charge transfer portion (HCCD) 54 and an output amplifier 55 are provided in the solid state imaging device.

Each of the vertical charge transfer portions 130 is provided in an adjacent position to the imaging cell 120 and is extended in a longitudinal direction (the direction of the arrow Y), and receives signal charges from each of the imaging cells 120 corresponding to one column and then transfers the signal charges per column sequentially in the direction of the arrow Y.

The line memory 52 is disposed on an output side of the vertical charge transfer portion 130 in each column. The signal charges corresponding to one row which are output from the respective vertical charge transfer portions 130 at the same time are temporarily stored on the line memory 52.

The signal charges corresponding to one column which are stored on the line memory 52 are transferred from the line memory 52 toward the horizontal charge transfer portion 54. As a result, the signal charges corresponding to one row appear over the horizontal charge transfer portion 54. The horizontal charge transfer portion 54 sequentially transfers the signal charges corresponding to one row held by itself on a pixel unit in a horizontal direction (the direction of the arrow X).

The signal charges appearing on an output of the horizontal charge transfer portion 54 in order is amplified by the output amplifier 55 and appears on an output terminal OUT.

Control signals required for implementing the reading operation, that is, a vertical transfer control signal φV (usually, a signal having a plurality of phases), a transfer control signal φLM and a horizontal transfer control signal φH (usually a signal having a plurality of phases) are generated by a timing signal generating circuit (not shown) respectively, and are applied to each of the vertical charge transfer portions 130, the line memory 52 and the horizontal charge transfer portion 54 in the solid state imaging device respectively. In some cases, the line memory 52 is omitted from the structure.

In the example shown in FIG. 2, moreover, a large number of imaging cells 120 are disposed to form a honeycomb-shaped pattern (a pattern obtained by shifting positions of the imaging cells to be arranged by a half pitch every row in the horizontal direction). Furthermore, color components to be detected are predetermined for each of the imaging cells 120 as shown in "G1", "G2", "B" and "R" in FIG. 2. More specifically, the imaging cells 120 for "G1" and "G2" detect a brightness having a green component, the imaging cells 120 for "B" detect a brightness having a blue component, and the imaging cells 120 for "R" detect a brightness having a red component.

The detecting colors are set by spectral characteristics of an optical filter disposed on a front surface of a light receiving plane of the imaging cell 120. In the example shown in FIG. 2, four types of filter columns FC1, FC2, FC3 and FC4 are disposed through a division every column of the imaging cell 120. The optical filter has a so-called array obtained by inclining a Bayer pattern by 45 degrees.

As shown in FIG. 2, the vertical charge transfer portion 130 is formed to take a meandering shape in an adjacent position to each of the columns of the imaging cells 120 every column. The vertical charge transfer portion 130 includes a vertical charge transfer channel 37 formed on a semiconductor substrate 35 and large numbers of first vertical transfer electrodes 41, second vertical transfer electrodes 43, first auxiliary transfer electrodes 45, second auxiliary transfer electrodes 46 and third auxiliary transfer electrodes 47 for a charge transfer which are disposed on the semiconductor substrate 35 through an electrical insulating film (not shown).

More specifically, by applying a predetermined voltage to each of the electrodes 41, 43, 45, 46 and 47 to form a predetermined potential distribution over the vertical charge transfer channel 37 and sequentially switching the voltage to be applied to the electrode, it is possible to sequentially transfer a signal charge of each pixel in a target direction in the vertical charge transfer portion (VCCD) 130.

The first vertical transfer electrodes 41 and the second vertical transfer electrodes 43 are formed one by one every row of the imaging cell 120. Each of the first vertical transfer electrodes 43 also functions as a reading gate for controlling a transfer of a signal charge from the imaging cell 120 to the vertical charge transfer channel 37 of the vertical charge transfer portion 130.

Any of the vertical transfer control signals having four phases (which are also referred to as driving pulses) φV1, φV2, φV3 and φV4 is applied to each of the second vertical transfer electrodes 43 and the first vertical transfer electrodes 41 which are alternately arranged in the direction of the arrow Y depending on a positional relationship of the arrangement of the second vertical transfer electrodes 43 and the first vertical transfer electrodes 41 as shown in FIG. 2. Similarly, the vertical transfer control signal φV2 is applied to the first auxiliary transfer electrode 45, the vertical transfer control signal φV3 is applied to the second auxiliary transfer electrode 46, and the vertical transfer control signal φV4 is applied to the third auxiliary transfer electrode 47.

As shown in FIG. 2, the line memory 52 is formed in an adjacent position (a downstream side with respect to the direction of the transfer of the signal charge) to a position of a final transfer stage of the vertical charge transfer portion 130 (the electrode 47 for controlling the signal charge on a lower side in FIG. 2). In order to control the transfer of the signal charge in the line memory 52, transfer control electrodes LM1 and LM2 are provided. The transfer control signal φLM is applied to the transfer control electrodes LM1 and LM2.

In a section of one of the imaging cells 120 in the solid state imaging device, as shown in FIG. 1, a photodiode (PD) 103 constituted by an N-type region, the vertical charge transfer portion (VCCD) 130 formed by an N-type region, a charge reading region 104 and a channel stop region 105 are formed in an N-type silicon substrate (N-sub corresponding to the semiconductor substrate 35) 101 on which a P-type semiconductor layer 102 is formed. Moreover, a thin P-type region 106 is formed on a surface side of the photodiode 103.

A gate electrode 107 is formed above the vertical charge transfer portion (VCCD) 130. The vertical charge transfer portion 130 and the gate electrode 107 are electrically isolated through an insulating layer which is not shown. A vertical charge transfer portion 130(1) shown in FIG. 1 belongs to the same column as the photodiode 103 and a vertical charge transfer portion 130(2) belongs to another adjacent column. In other words, a signal charge generated by a photoelectric conversion of the photodiode 103 shown in FIG. 1 is moved onto a channel of the vertical charge transfer portion 130(1) through the charge reading region 104 by an electric potential control depending on a voltage to be applied to the gate electrode 107 and is not moved to the vertical charge transfer portion 130(2) in an adjacent column. The photodiode 103 and the vertical charge transfer portion 130(2) in the adjacent column are isolated from each other through a channel stop region 105(2).

There is a possibility that an electron generated in the P$^+$ region (106) might be diffused over the surface of the embedded photodiode (103) and be mixed into the vertical charge transfer portion (VCCD) 130(2) in the adjacent column. Consequently, a smear is caused. In order to suppress the influence of the diffusion current, in the solid state imaging device shown in FIG. 1, each of the gate electrodes 107 is formed by using P$^+$-type polysilicon. In the solid state imaging device having the NMOS structure shown in FIGS. 1 and 2, N$^+$-type polysilicon is usually utilized as a material. Herein, the P$^+$-type polysilicon is particularly used. The reason is as follows.

A work function has a great difference between the N-type polysilicon and the P-type polysilicon which can be utilized as a material for the gate electrode. For example, the work function has almost a difference in an amount corresponding to a band gap difference (approximately 1.1 V) between N$^+$-type polysilicon and P$^+$-type polysilicon, for example. The "work function" represents the lowest energy which is required for an electron to get out of a metal.

In other words, if the material of the gate electrode is changed from the N-type polysilicon to the P-type polysilicon, an electric potential distribution between the photodiode 103 to be a photoelectric converting portion and the vertical charge transfer portion 130 is varied depending on a difference between their work functions so that a movement of a carrier generated by the photodiode is changed greatly. More specifically, when the material of the gate electrode is changed from the N-type polysilicon to the P-type polysilicon, the same result as that in an effective application of a potential of (VM-1.1(V)) is obtained. Even if a negative bias is not applied as the medium potential (VM) from an outside, therefore, it is possible to obtain the same result as that in the application of the negative bias. Therefore, it is possible to effectively reduce the smear while maintaining a characteristic of the embedded photodiode without applying a special voltage (a negative bias) from the outside to the gate electrode.

As shown in FIG. 1, a surface side of the silicon substrate 101 is covered with a shielding film 111 except for a region of a light receiving surface of the photodiode 103 in order to prevent an extra light from being incident. Moreover, the filter columns FC2, FC3 and FC4 provided every column are disposed above the light receiving surface of the photodiode 103 so as to be opposed thereto, and a microlens 112 which is independent every cell is further disposed on their upper surfaces.

Figure 3:
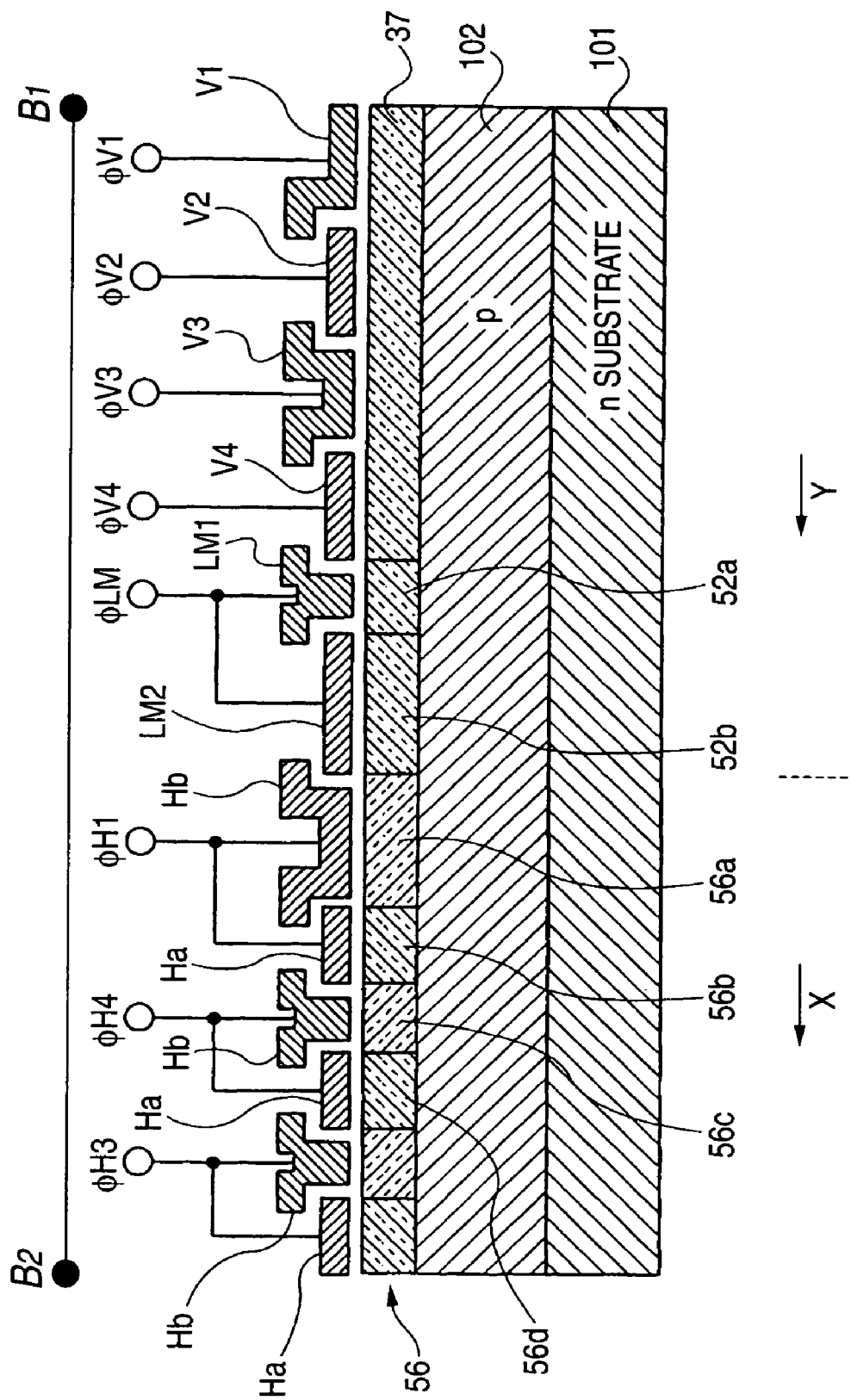
FIG. 3 is an enlarged sectional view showing a structure of a section taken along a B1-B2 line in the solid state imaging device illustrated in FIG. 2.

A structure (a section taken along a B1-B2 line) in the vicinity of the line memory 52 and the horizontal charge transfer portion 54 in the solid state imaging device shown in FIG. 2 is illustrated in an enlarging state in FIG. 3. As shown in FIG. 3, the horizontal charge transfer portion 54 has one horizontal charge transfer channel 56 extended like a band in the direction of the arrow X and horizontal transfer electrodes Ha and Hb formed above the horizontal charge transfer channel 56. Large numbers of horizontal transfer electrodes Ha and Hb are provided and disposed alternately. The respective horizontal transfer electrodes Ha are formed to take a rectangular shape seen on a plane, and the respective horizontal transfer electrodes Hb have ends to take an inverted L shape seen on a plane.

A pair of horizontal transfer electrodes Ha and Hb present in adjacent positions are electrically connected in common, and any of horizontal transfer control signals (which are also referred to as driving pulses) φH1, φH2, φH3 and φH4 having four phases is applied to the horizontal transfer electrodes Ha and Hb arranged in order depending on positions in which the horizontal transfer electrodes Ha and Hb are arranged.

As shown in FIG. 3, the vertical charge transfer channel 37 for the vertical charge transfer portion 130, charge transfer channels 52a and 52b for the line memory 52 and the horizontal charge transfer channel 56 for the horizontal charge transfer portion 54 are formed in the N-type silicon substrate 101 on which the P-type semiconductor layer 102 is formed.

The signal charge read from the photodiode 103 of the imaging cell 120 is transferred to the output portion OUT (see FIG. 2) through the vertical charge transfer channel 37, the charge transfer channels 52a and 52b, and the horizontal charge transfer channel 56 in order.

Vertical transfer electrodes V2, V3 and V4 are provided above the vertical charge transfer channel 37 in order from an upstream to a downstream in a direction of the charge transfer (the direction of the arrow Y). The vertical transfer electrodes V1, V2, V3 and V4 shown in FIG. 3 correspond to the second vertical transfer electrode 43 on a most downstream, the first auxiliary transfer electrode 45, the second auxiliary transfer electrode 46 and the third auxiliary transfer electrode 47 in FIG. 2, respectively.

The vertical charge transfer channel 37 of the vertical charge transfer portion 130 is formed as an N-type impurity region. Referring to the line memory 52, moreover, the charge transfer channel 52a is formed in an N$^-$-type impurity region and the charge transfer channel 52b is formed in an N-type impurity region.

The horizontal charge transfer channel 56 of the horizontal charge transfer portion 54 is constituted by the N-type impurity region and the N$^-$-type impurity region which are arranged alternately. Each of the horizontal transfer electrodes Ha is disposed in a position placed above the N-type impurity region and each of the horizontal transfer electrodes Hb is disposed in a position placed above the N$^-$ type impurity region. The horizontal transfer electrode Hb is provided around a region between the transfer control electrode LM2 of the line memory 52 and the horizontal transfer electrode Ha. The N$^-$-type impurity region is also provided below the wraparound portion.

Figure 4:
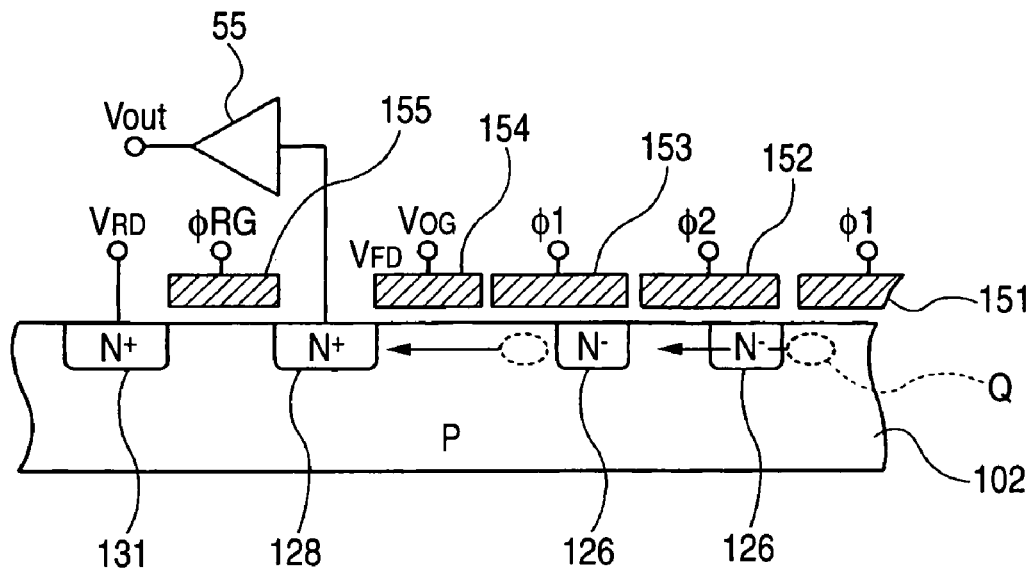
FIG. 4 is a sectional view showing a structure in the vicinity of an output terminal of the solid state imaging device illustrated in FIG. 2.

FIG. 4 is a sectional view showing a structure in the vicinity of an output terminal of the solid state imaging device illustrated in FIG. 2.

As shown in FIG. 4, an N$^-$ region 126 and N$^+$ regions 128 and 131 are formed on a surface of the P-type semiconductor layer 102. The N$^+$ region 128 constitutes a floating diffusion layer. The output amplifier 55 is connected to the floating diffusion layer 128. A source follower using an MOCS transistor is utilized for the output amplifier 55. In FIG. 4, VFD represents a potential of the floating diffusion layer 128. Moreover, the N$^+$ region 131 constitutes a reset drain (RD). The reset drain (RD) 131 is set to a reset drain potential VRD.

In FIG. 4, 151 to 155 denote an electrode. A driving pulse φ1 is applied to the electrodes 151 and 153 and a driving pulse φ2 is applied to the electrode 152. Moreover, the electrode 154 denotes a horizontal transfer output gate, and a predetermined DC voltage VOG is always applied to the electrode 154. Furthermore, the electrode 155 constitutes a reset gate, and a reset gate clock φRG is applied to the reset gate 155. In FIG. 4, Q shown in a dotted line indicates a charge and an arrow shows a state of a movement (transfer) of the charge Q.

Voltages to be applied as the signals (φ1, φ2, φRG, VFD) from the outside to the solid state imaging device are sequentially switched in accordance with a predetermined control procedure so that the charge Q is moved from a position placed under the electrode to which φ1 is applied to a position placed under the electrode to which φ2 is applied, and furthermore, a position placed under the electrode to which φ1 is applied, and subsequently, a position of the floating diffusion layer 128 and is output as a voltage corresponding to an amount of the charge from the output amplifier 55 as shown in an arrow of FIG. 4.

As described above, a detected light is converted into the charge and is output as a voltage signal.

Next, description will be given to a simulation carried out by using a computer in order to confirm an effect produced by changing the material of the gate material 107 from the N-type polysilicon to the P-type polysilicon in the solid state imaging device having the NMOS structure as in the solid state imaging device illustrated in FIG. 2.

Figure 5:
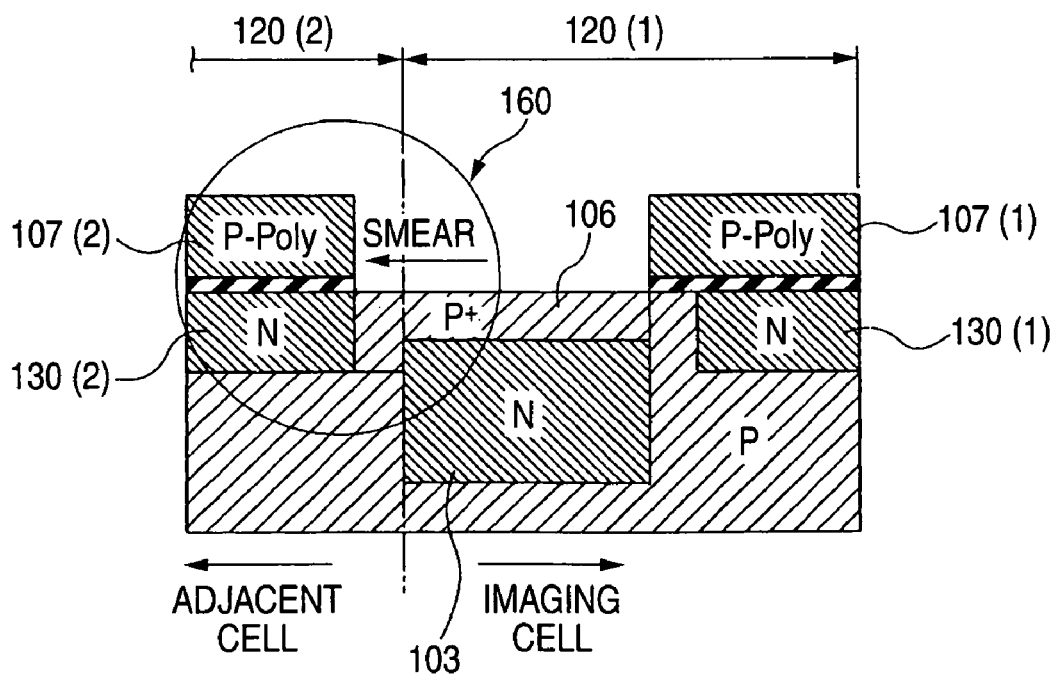
Figure 6B:
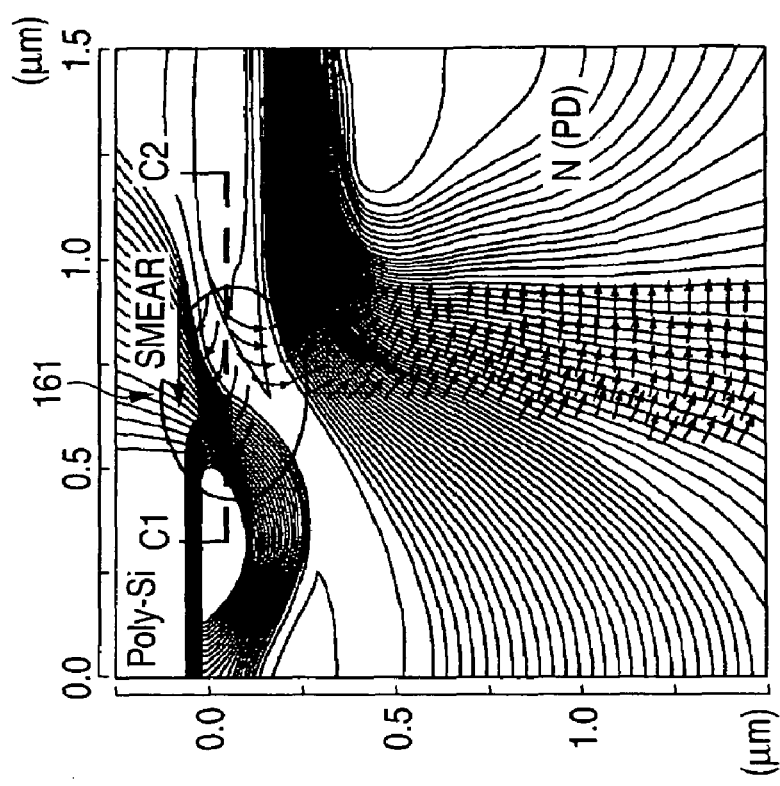
FIG. 6A is a chart showing a model of a structure and FIG. 6B is a chart showing an electric potential and a flow of a diffusion current.
Figure 6A:
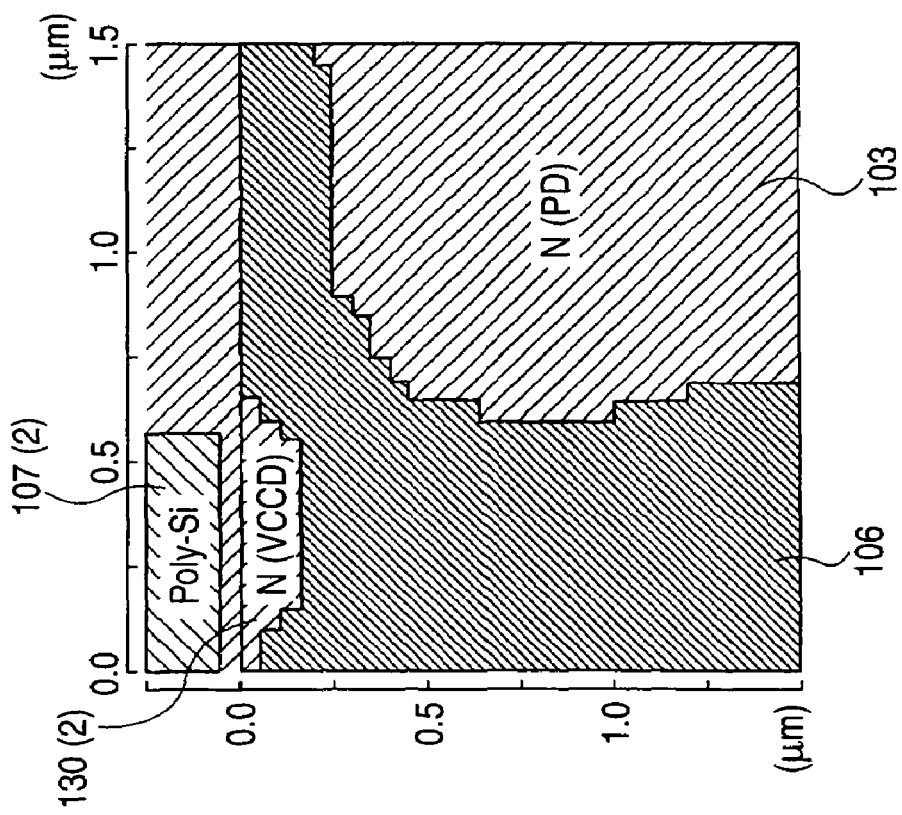

FIG. 5 is an enlarged sectional view showing a sectional structure related to an imaging cell and a periphery thereof in the solid state imaging device shown in FIG. 2, and FIGS. 6A and 6B are typical views illustrating a result of the simulation related to the imaging cell and the periphery thereof shown in FIG. 5.

In the simulation, there were examined a most surface potential distribution and a diffusion current thus flowing between adjacent cells for a region 160 in the vicinity of a boundary between an imaging cell 120(1) and another imaging cell 120(2) which is adjacent thereto as shown in FIG. 5.

More specifically, FIG. 6A shows a model of a structure, illustrating the region 160 of FIG. 5 in the solid state imaging device using the P-type polysilicon as the gate electrode 107 which is enlarged. In FIG. 6B, an electric potential is represented as a contour line and a flow of a diffusion current is shown in a small arrow.

Conditions assumed in the simulation are as follows.

A size of each imaging cell: 2 μm×2 μm

A difference in a work function between P-poly and N-poly: 1.1 V

If the material of the gate electrode 107 is simply changed from the N-type polysilicon to the P-type polysilicon, moreover, a potential of the vertical charge transfer portion (VCCD) 130 is shallowed so that a saturation capacity of the VCCD is decreased and a signal charge is also read in the reading portion with difficulty. In the simulation, therefore, a VCCD (BC) dose is regulated (an impurity concentration is increased) in such a manner that a saturation capacity of the VCCD is not changed, and furthermore, a channel dose (TGI) is regulated (the impurity concentration is reduced) in such a manner that a reading characteristic is not varied in addition to the change of the material for the gate electrode 107 from the N-type polysilicon to the P-type polysilicon.

Figure 7:
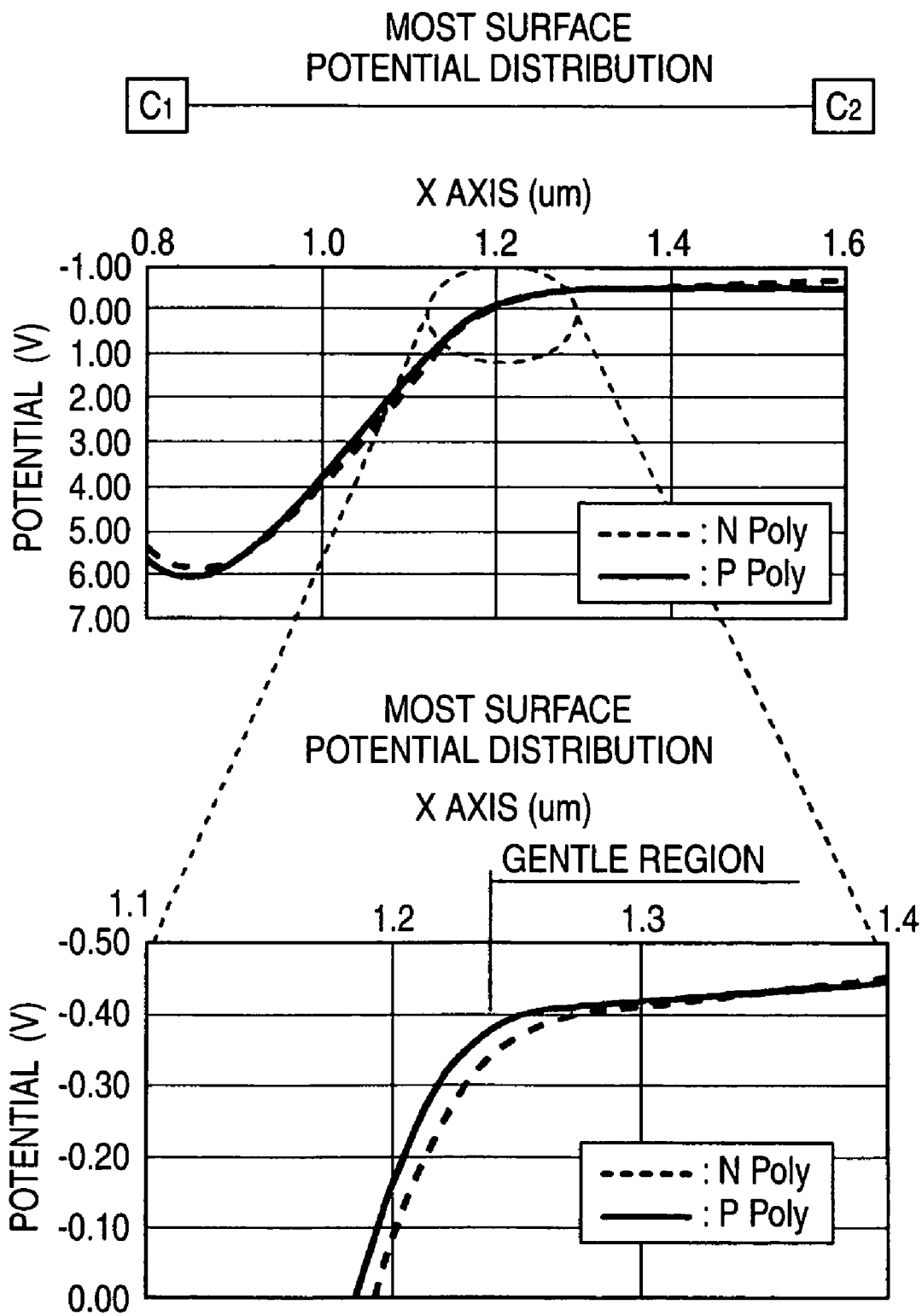
FIG. 7 is a graph representing a result of a simulation related to the imaging cell and the periphery illustrated in FIG. 5.

With reference to FIG. 6B, a diffusion current flowing downward from the gate electrode 107 appears in a portion of a circled region 161. A smear is caused by the diffusion current. FIG. 7 shows a result obtained by examining the diffusion current in detail.

FIG. 7 is a graph showing a surface potential distribution for each of the case in which the P-type polysilicon (P-poly) is used as the material of the gate electrode 107 and the case in which the N-type polysilicon (N-poly) is used as the material of the gate electrode 107.

With reference to the graph of FIG. 7, a curve shown in a solid line represents the case in which the P-type polysilicon (P-poly) is used as the material of the gate electrode 107 and a curve shown in a dotted line represents the case in which the N-type polysilicon (N-poly) is used as the material of the gate electrode 107. In their comparison, a clear difference is made in the surface potential distribution, and a region having a small gradient of an electric potential is longer in the P-type polysilicon than that in the N-type polysilicon. Consequently, the generation of the smear is suppressed. In other words, when a carrier (an electron) generated by a photoelectric conversion is dropped into the photodiode 103 or the vertical charge transfer portion 130 by a diffusion in the thin P-type region 106 provided on the surface side of the photodiode 103, the carrier contributes to a sensitivity if it is dropped to the photodiode 103 side and the smear is generated if the carrier is dropped to the vertical charge transfer portion 130 side. At this time, referring to the diffusion of the carrier, a rate of the drop to the photodiode 103 is increased if the region having a small potential gradient is comparatively longer. In the P-type polysilicon, accordingly, the sensitivity can be enhanced more highly and the smear can be suppressed more greatly. More specifically, it is possible to produce an advantage that the smear caused by the diffusion current can be reduced by approximately 15% because of the difference.

Referring to the cause of the smear, most of the diffusion current (95% or more based on a calculation) flows into an adjacent pixel VCCD forming a thick device isolating region. When the VCCD dose is regulated, therefore, the effect of reducing the smear is reduced. However, the effect is rarely influenced by the regulation of the channel dose.

Moreover, the extent of the smear caused by the foregoing is determined depending on a distance between an open end of the photodiode 103 and the vertical charge transfer portion 130 in an adjacent column. Therefore, it can be anticipated that the extent will be further remarkable in the future by a further microprocessing of each imaging cell.

Next, description will be given to a specific example of a process for manufacturing the solid state imaging device.

FIGS. 8A to 8E and 9A to 9E show an example of the process for manufacturing the solid state imaging device according to the embodiment.

Figure 8A:
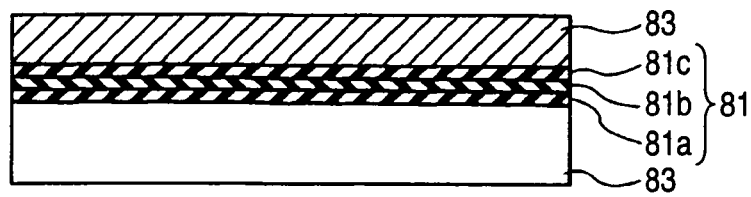
FIGS. 8A to 8E is an explanatory view (No. 1) showing an example of a process for manufacturing the solid state imaging device.

First of all, as shown in FIG. 8A, a silicon oxide film 81a, a silicon nitride film 81b and a silicon oxide film 81c are formed on a surface of the n-type silicon substrate 101 so that a gate oxide film 81 having a three-layer structure is formed.

Subsequently, P-type polysilicon doped with B (boron) is formed on the gate oxide film 81 by low pressure CVD using $SiH_4$ and $BCl_3$ or $B_2H_6$. Alternatively, non-doped polysilicon may be formed and B (boron) ions may be implanted to obtain a P type.

Figure 8B:
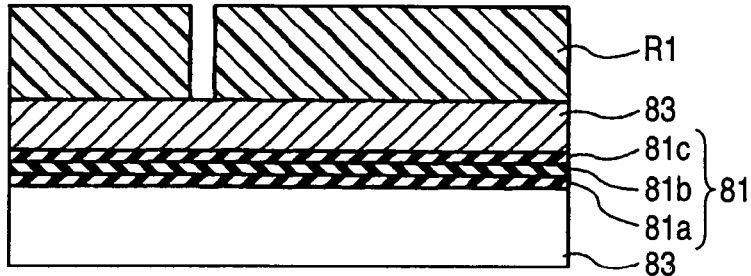

As shown in FIG. 8B, then, a desirable mask is used to carry out exposure, development and washing by photolithography so that a resist pattern R1 is formed.

Figure 8C:
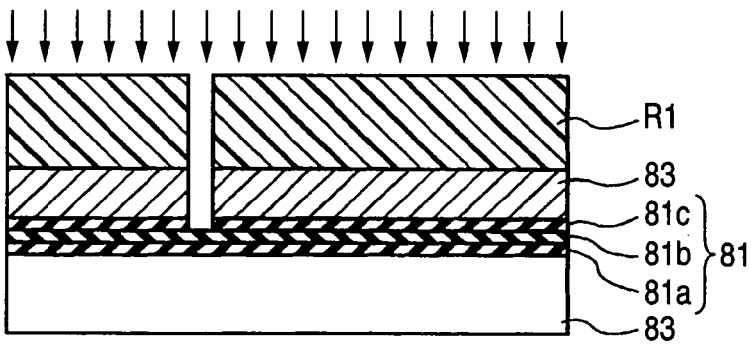

As shown in FIG. 8C, thereafter, a polycrystalline silicon film 83 is selectively etched and removed by using the silicon nitride film 81b of the gate oxide film 81 as an etching stopper through reactive ion etching using a mixed gas of HBr and $O_2$ utilizing the resist pattern R1 as a mask. Thus, an electrode is formed. It is desirable to use an etching apparatus such as a high density plasma.

By using the resist pattern R1 as a mask, subsequently, an ion implantation for compensating for a transfer efficiency is carried out. A boron ion is implanted on a predetermined condition. Then, the resist pattern R1 is then removed by ashing.

Figure 8D:
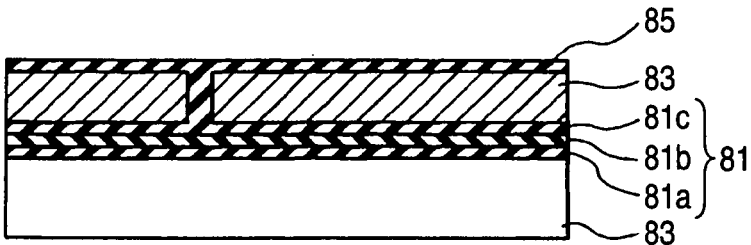

Thereafter, an interelectrode insulating film 85 constituted by a silicon oxide film is formed on a surface of an electrode pattern by the low pressure CVD (FIG. 8D).

Figure 8E:
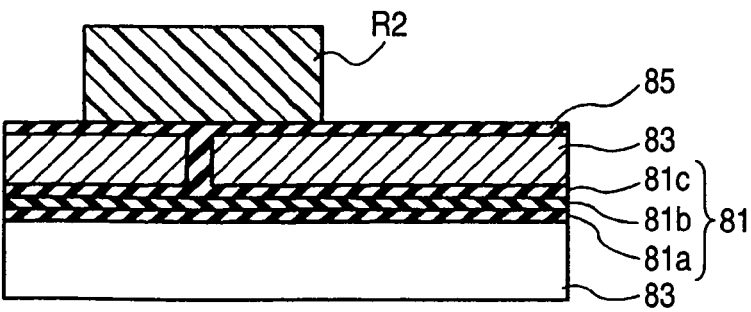

Next, a resist is applied to form a resist pattern R2 having an opening in a photodiode formation region to be a photoelectric converting portion by the photolithography (FIG. 8E).

Figure 9A:
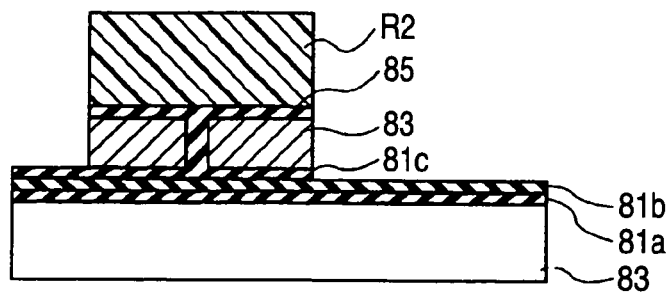
FIGS. 9A to 9E is an explanatory view (No. 2) showing an example of the process for manufacturing the solid state imaging device.

Subsequently, the polycrystalline silicon film 83 is selectively etched and removed by using the silicon nitride film 81b of the gate oxide film 81 as an etching stopper through the reactive ion etching using a mixed gas of HBr and $O_2$ utilizing the resist pattern R2 as a mask. Thus, the photodiode formation region is opened (FIG. 9A).

Figure 9B:
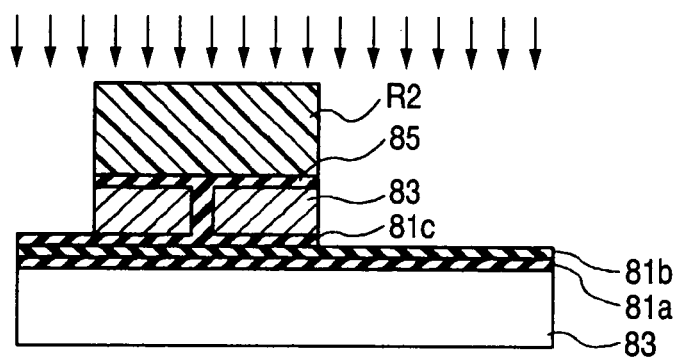
Figure 9C:
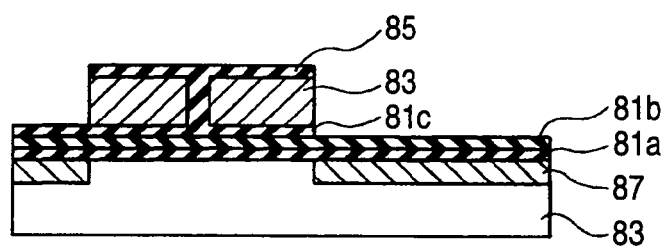

As shown in FIG. 9B, then, the resist pattern R2 is exactly left and an ion implantation for forming a pn junction of the photodiode is carried out by using the resist pattern R2 as a mask so that a diffusion region 87 for forming the pn junction with the substrate 101 is formed as shown in FIG. 9C.

Figure 9D:
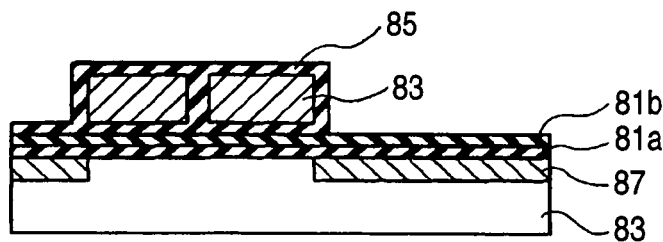

As shown in FIG. 9D, thereafter, a sidewall of the electrode 83 is oxidized so that a silicon oxide film is also formed on the sidewall of the electrode 83.

Figure 9E:
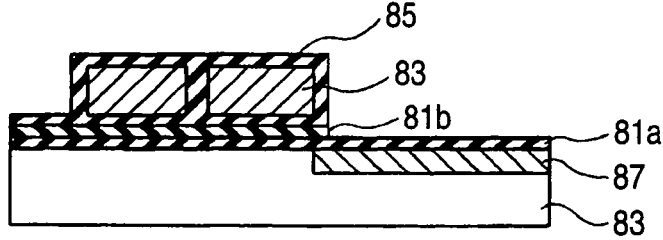

As shown in FIG. 9E, subsequently, the silicon nitride film 81b is removed by etching to form a solid state imaging device having a single layer electrode structure which includes the P-type gate electrode 83.

The manufacturing process is an example of the formation of the P-type gate electrode 83. In addition, various changes can be made.

Second Embodiment

Next, description will be given to a second embodiment of the solid state imaging device according to the invention.

Figure 10:
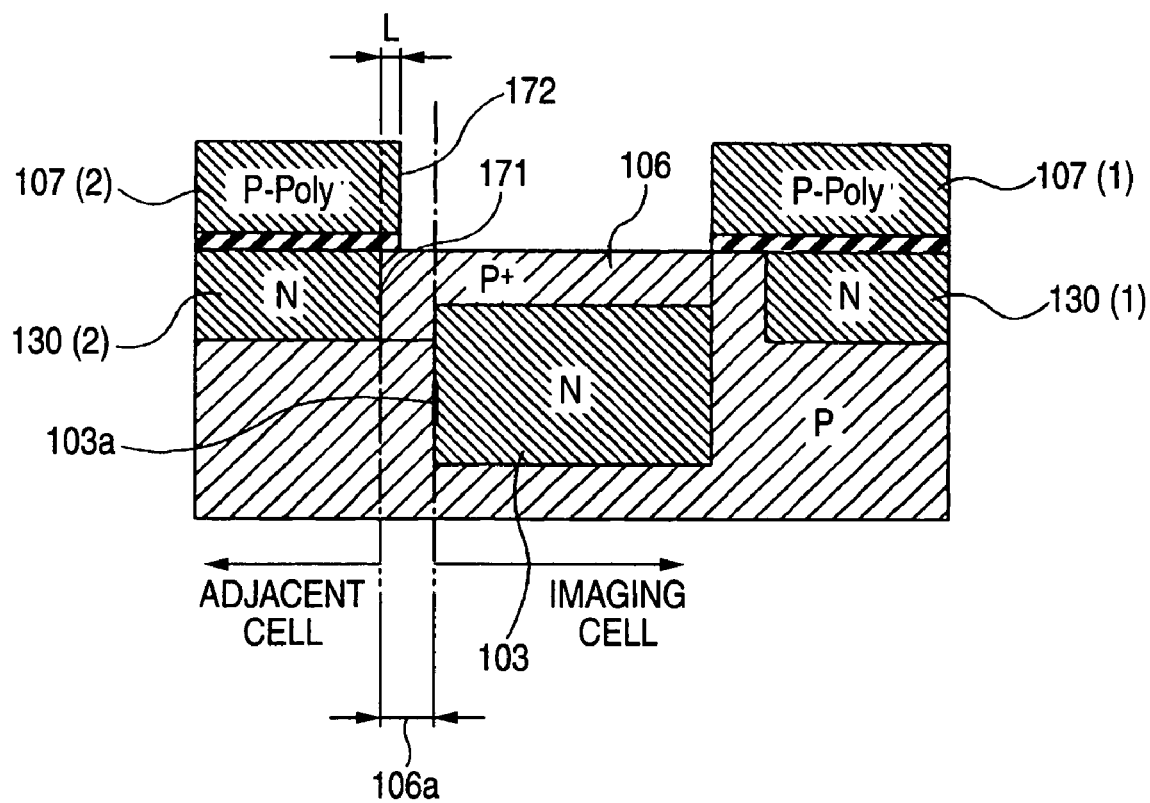
FIG. 10 is an enlarged sectional view showing a sectional structure related to an imaging cell and a periphery thereof in a solid state imaging device according to a second embodiment.

FIG. 10 is an enlarged sectional view showing a sectional structure related to an imaging cell and a periphery thereof in the solid state imaging device according to the second embodiment.

The structure of the solid state imaging device according to the embodiment is the same as the structure shown in FIG. 5 except for a shape of a gate electrode 107. In FIG. 10, therefore, elements corresponding to the contents shown in FIG. 5 have the same reference numerals.

The structure shown in FIG. 10 has a great feature that a gate electrode 107(2) in an adjacent column is protruded from an end position on a photodiode 103 side of a vertical charge transfer portion 130(2) toward the photodiode 103 side. More specifically, an end 171 of the vertical charge transfer portion 130(2) is not coincident with an end 172 of the gate electrode 107(2) differently from FIG. 5 but their positions are shifted from each other in a horizontal direction and the end 172 of the gate electrode 107(2) is protruded by a distance L toward an imaging cell in an adjacent column.

With the structure, it is possible to increase the effect of suppressing the flow of a diffusion current to the vertical charge transfer portion 130(2) in another adjacent column from the photodiode 103 through a surface of a P-type region 106, and the smear can be suppressed more effectively.

When the amount (L) of the protrusion of the end 172 of the gate electrode 107(2) is excessively large, there is a high possibility that a signal charge of the photodiode 103 might be read into the vertical charge transfer portion 130(2) in the adjacent column when the signal charge is to be read. Referring to the amount of the protrusion of the end 172, accordingly, it is necessary to determine the amount (L) of the protrusion in a position of an isolating region 106a for partitioning a portion from an end 103*a* of the photodiode 103 to the end 171 of the vertical charge transfer portion 130(2).

Third Embodiment

Next, description will be given to a third embodiment related to the solid state imaging device according to the invention.

Figure 11:
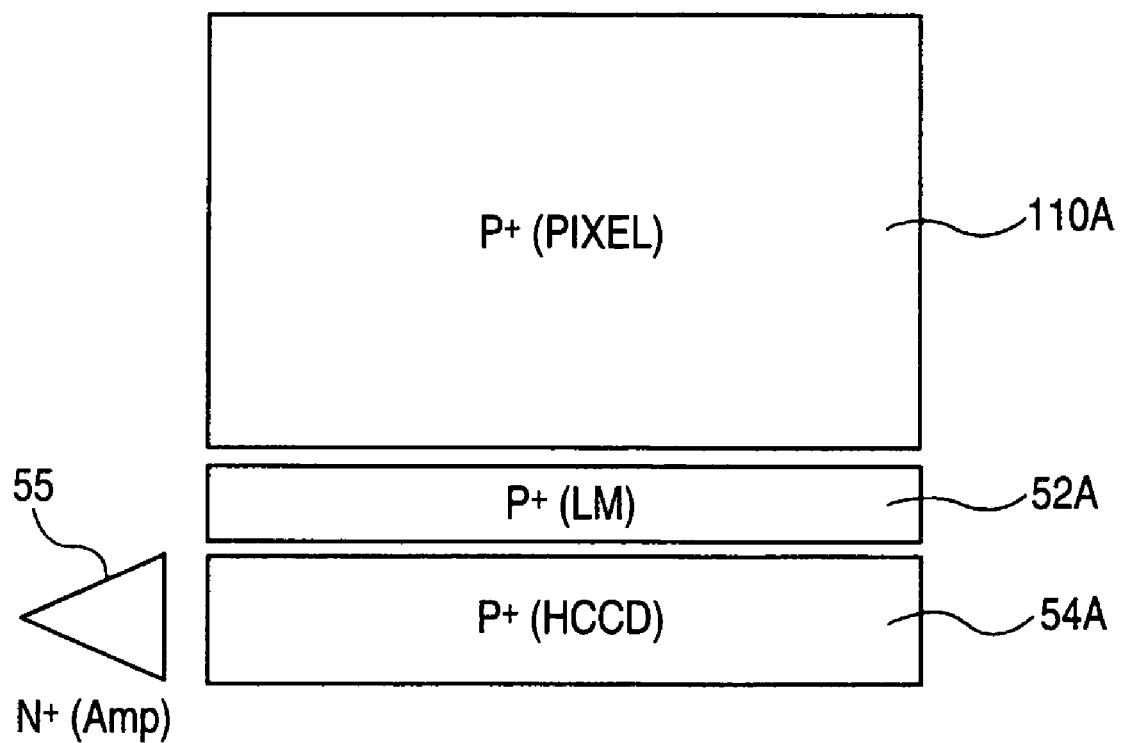
FIG. 11 is a plan view showing a structure of a solid state imaging device according to a third embodiment.

FIG. 11 is a plan view showing a structure of the solid state imaging device according to the third embodiment.

The embodiment is a variant of the first embodiment. The solid state imaging device shown in FIG. 11 is also constituted by using an NMOS process in the same manner as in the first embodiment, and comprises an imaging portion 110A, a line memory 52A, a horizontal charge transfer portion 54A and an output amplifier 55. While only the gate electrode 107 is constituted by P$^+$-type polysilicon in the first embodiment, other electrodes are also constituted by the P$^+$-type polysilicon in the solid state imaging device shown in FIG. 11.

More specifically, referring to the imaging portion 110A, charge transfer electrodes to be used for transferring a signal charge over a channel of each vertical charge transfer portion 130 (which correspond to the first vertical transfer electrode 41, the second vertical transfer electrode 43, the first auxiliary transfer electrode 45, the second auxiliary transfer electrode 46 and the third auxiliary transfer electrode 47 in FIG. 2) as well as the gate electrode 107 are constituted by the P$^+$-type polysilicon. Referring to the line memory 52A, moreover, charge transfer electrodes (corresponding to LM1 and LM2 in FIG. 3) are also constituted by the P$^+$-type polysilicon. Referring to the horizontal charge transfer portion 54A, furthermore, charge transfer electrodes (corresponding to Ha and Hb in FIGS. 3 and 151 to 154 and 155 in FIG. 4) are constituted by the P$^+$-type polysilicon. Electrodes of the output amplifier 55 and the other circuits are constituted by N-type polysilicon in the same manner as in a general device having an NMOS structure.

According to the solid state imaging device, the whole charge transfer electrode is formed by P-type polysilicon so that N- and P-type polysilicon electrodes are not partially mixed in the device. Thus, it is possible to simplify a device structure and a manufacturing process.

A specific structure related to the gate electrode 107 provided in the solid state imaging device may be a general two-layer polysilicon layer structure, a dummy single layer structure, a single layer structure or a polycide structure.

Figure 12:
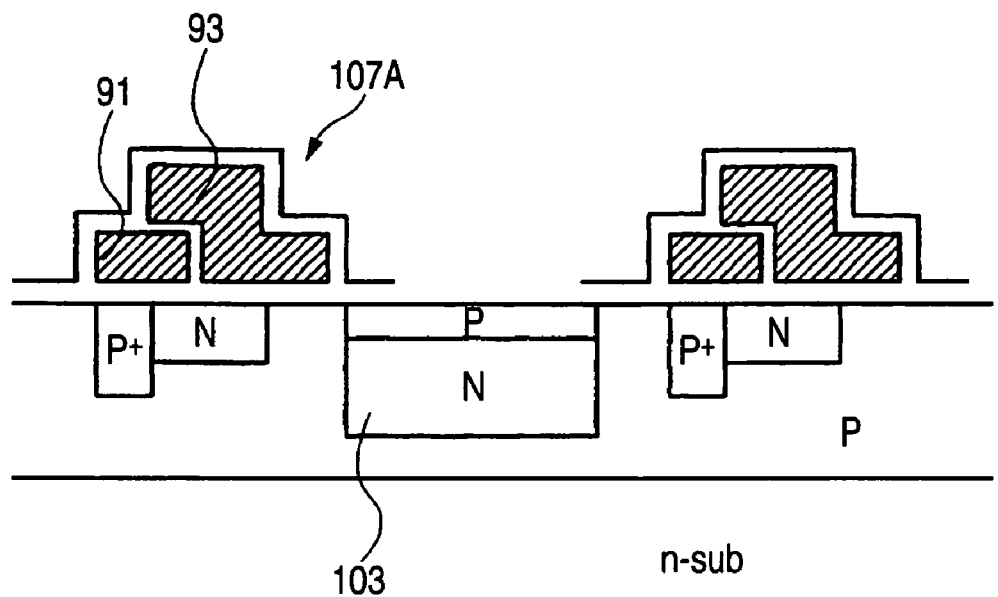
FIG. 12 is a typical view showing an example of a structure of an electrode in the case of a two-layer polysilicon structure.

FIG. 12 typically shows an example of a structure of an electrode in the case of the two-layer polysilicon structure. As shown in FIG. 12, referring to the electrode of a two-phase polysilicon structure, a gate electrode 107A has such a structure that a first electrode 91 and a second electrode 93 partially overlap each other in a vertical direction.

Figure 13:
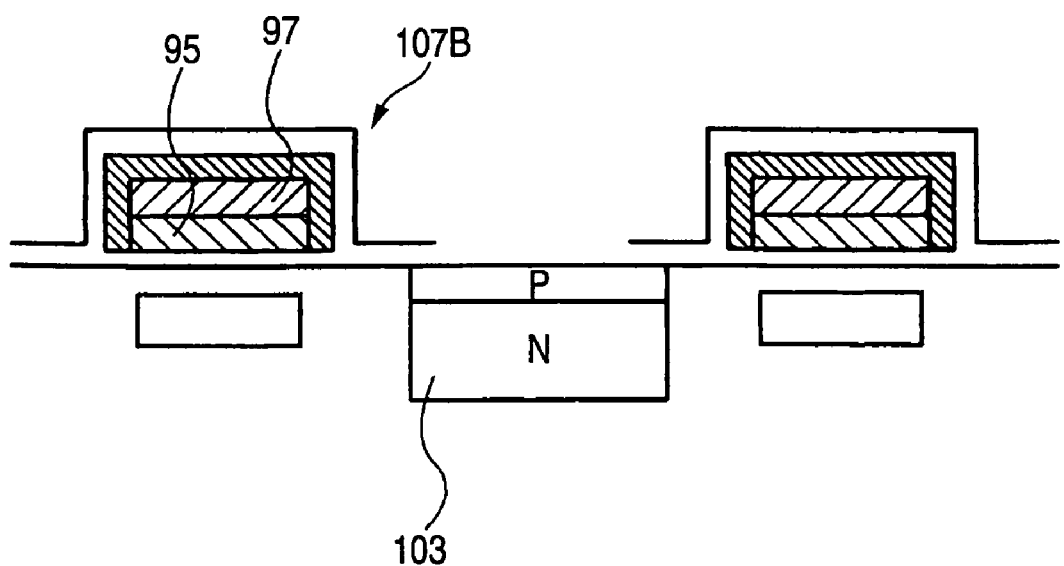
FIG. 13 is a typical view showing an example of a structure of an electrode in the case of a polycide structure.
Figure 14:
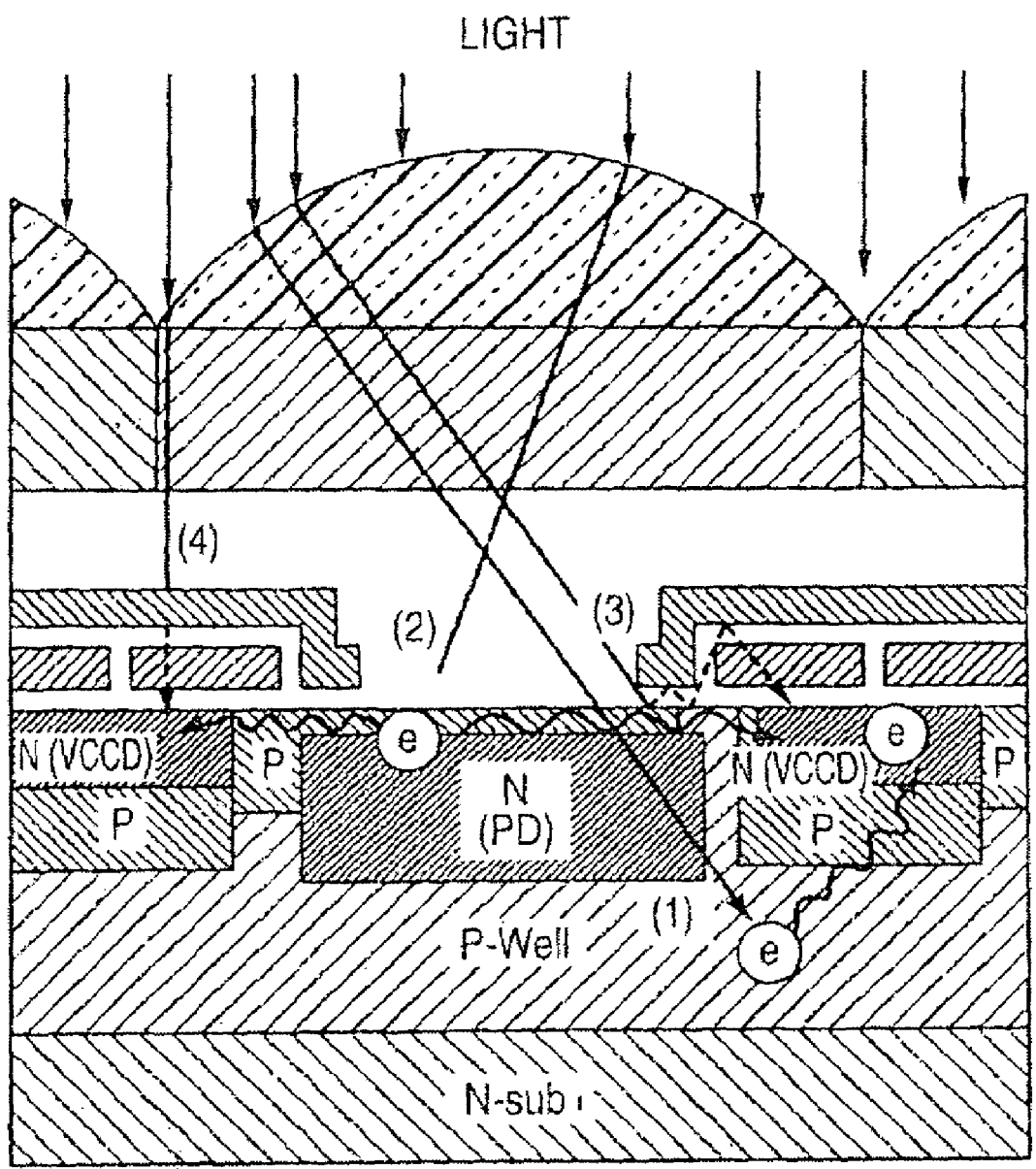
FIG. 14 is a longitudinal sectional view showing a sectional structure related to an imaging cell and a periphery thereof in a solid state imaging device having a general structure and a smear generating mechanism.
Figure 16:
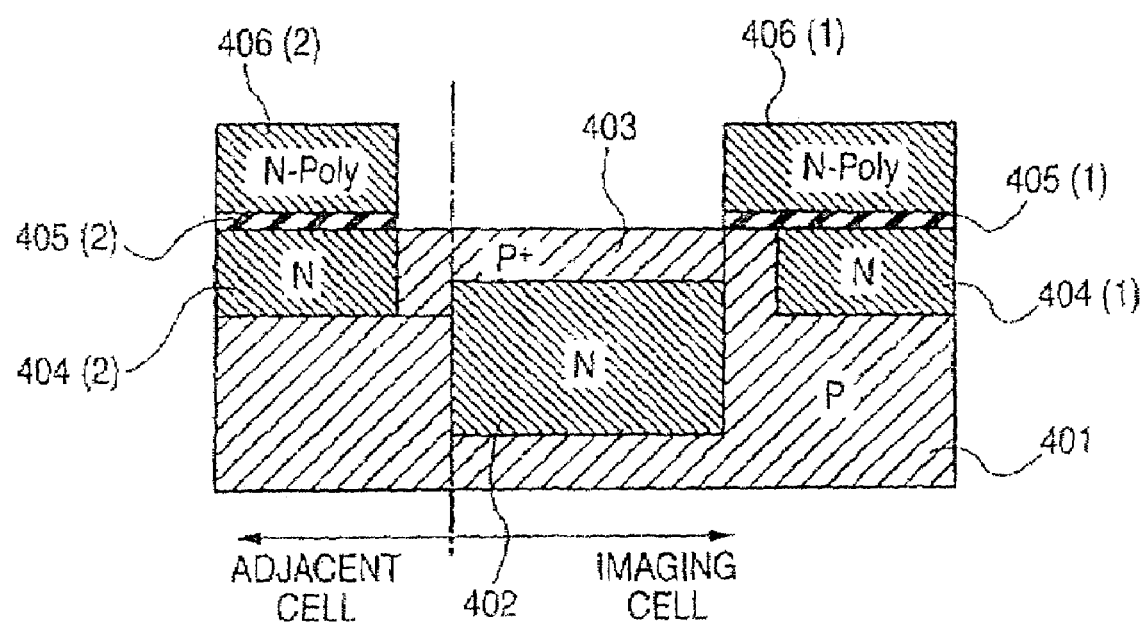
FIG. 16 is a sectional view showing a structure of a solid state imaging device using an NMOS process with a general structure.

Moreover, FIG. 13 typically shows an example of a structure of an electrode in the case of the polycide structure. As shown in FIG. 13, referring to the electrode of the polycide structure, a gate electrode 107B constituted by tungsten polycide is formed by laminating a polycrystalline silicon layer 95 and a tungsten polycide layer 97 provided thereon. The structure of the electrode using the polycide of this type has also been disclosed in JP-A-2005-353766, for example. By forming the gate electrode as a P-type polysilicon electrode, similarly, it is possible to obtain the same advantages.

While the solid state imaging device is constituted by using the NMOS process in each of the embodiments, it is a matter of course that the solid state imaging device can also be constituted by using a PMOS process. In the case in which the solid state imaging device is constituted by using the PMOS process, it is preferable to use the N-type polysilicon as the material of the gate electrode 107. Consequently, it is possible to reduce a smear in the same manner as in each of the embodiments.

According to the invention, it is possible to effectively reduce a smear while maintaining a characteristic of an embedded photodiode without applying a special voltage (a negate bias) from an outside to a gate electrode.

As described above, the solid state imaging device according to the invention can effectively reduce a smear while maintaining a characteristic of an embedded photodiode without applying a special voltage (a negative bias) from an outside to a gate electrode. By applying the invention to a two-dimensional CCD image sensor such as a digital camera, accordingly, it is possible to suppress the smear generated in the case in which a subject having a high luminance is to be photographed.

The entire disclosure of each and every foreign patent application from which the benefit of foreign priority has been claimed in the present application is incorporated herein by reference, as if fully set forth.

What is claimed is:

1. A solid state imaging device comprising:
   a photoelectric converting portion provided on a semiconductor substrate;
   a charge transfer path, formed in an adjacent position to the photoelectric converting portion, that receives a signal charge generated in the photoelectric converting portion and transfers the signal charge in a predetermined direction; and
   a gate electrode that transfers the signal charge from the photoelectric converting portion to the charge transfer path,
   wherein the gate electrode comprises polysilicon having a different conductive type from that of a semiconductor region forming a charge storing portion of the charge transfer path,
   wherein the charge storing portion of the charge transfer path is formed in an adjacent position to the photoelectric converting portion and is not part of the photoelectric converting portion.

2. The solid state imaging device according to claim 1,
   wherein the semiconductor region forming the charge storing portion of the charge transfer path has an N conductive type, and
   the gate electrode comprises polysilicon having a P conductive type.

3. The solid state imaging device according to claim 2, further comprising, as the charge transfer path:
   a plurality of vertical charge transfer paths that transfers a signal charge received from the photoelectric converting portion in a vertical direction; and
   a horizontal charge transfer path, formed on a downstream side of the vertical charge transfer path, that transfers the signal charge received through the vertical charge transfer path in a horizontal direction,
   wherein the solid state imaging device further comprises a charge transfer electrode that controls transfer of the signal charge for at least one of the vertical charge transfer paths and the horizontal charge transfer path, the charge transfer electrode comprising polysilicon having a P conductive type.

4. The solid state imaging device according to claim 2, further comprising, as the charge transfer path:
   a plurality of vertical charge transfer paths that transfers a signal charge received from the photoelectric converting portion in a vertical direction;

a line memory, formed on a downstream side of the vertical charge transfer path, that executes to hold and transfer the signal charge received from the vertical charge transfer path; and a horizontal charge transfer path, formed on a downstream side of the line memory, that transfers the signal charge received through the line memory in a horizontal direction, wherein the solid state imaging device further comprises a charge transfer electrode that controls transfer of the signal charge for at least one of the vertical charge transfer paths, the line memory and the horizontal charge transfer path, the charge transfer electrode comprising polysilicon having a P conductive type.

5. The solid state imaging device according to claim 3, wherein the photoelectric converting portions and the vertical charge transfer paths form a plurality of columns, in which each of the columns comprises: a set of ones of the photoelectric converting portions: and one of the vertical charge transfer paths adjacent to the set of ones of the photoelectric converting portions, a first one of the columns comprises: a set of first ones of the photoelectric converting portions; and first one of the vertical charge transfer paths, a second one of the columns comprises: a set of second ones of the photoelectric converting portions; and second one of the vertical charge transfer paths, the first and second ones of the columns are adjacent to each other, a device isolating region is formed between the set of first ones of the photoelectric converting portions and the second one of the vertical charge transfer paths, and the charge transfer electrode controls signal charge transfer of the second one of the vertical charge transfer paths and is formed to be protruded to an intermediate position of the device isolating region from a position of the second one of the vertical charge transfer paths toward the set of first ones of the photoelectric converting portions which is adjacent thereto.

6. The solid state imaging device according to claim 4, wherein the photoelectric converting portions and the vertical charge transfer paths form a plurality of columns, in which each of the columns comprises: a set of ones of the photoelectric converting portions: and one of the vertical charge transfer paths adjacent to the set of ones of the photoelectric converting portions, a first one of the columns comprises: a set of first ones of the photoelectric converting portions; and first one of the vertical charge transfer paths, a second one of the columns comprises: a set of second ones of the photoelectric converting portions; and second one of the vertical charge transfer paths, the first and second ones of the columns are adjacent to each other, a device isolating region is formed between the set of first ones of the photoelectric converting portions and the second one of the vertical charge transfer paths, and the charge transfer electrode controls signal charge transfer of the second one of the vertical charge transfer paths and is formed to be protruded to an intermediate position of the device isolating region from a position of the second one of the vertical charge transfer paths toward the set of first ones of the photoelectric converting portions which is adjacent thereto.

7. A method of manufacturing the solid state imaging device according to claim 1, the method comprising:

forming a first conductive type layer for forming the charge storing portion of the charge transfer path on the semiconductor substrate; and forming a gate electrode having a second conductive type which is different from the first conductive type layer on the first conductive type layer through an insulating layer.

8. The solid state imaging device according to claim 1, wherein said gate electrode is doped P-type and said charge storing portion of the charge transfer path is doped N-type.

* * * * *